US010225937B1

(12) United States Patent
Weiden

(10) Patent No.: US 10,225,937 B1
(45) Date of Patent: Mar. 5, 2019

(54) ELECTRICAL ENCLOSURE DOOR INTERLOCK

(71) Applicant: Schneider Electric USA, Inc., Andover, MA (US)

(72) Inventor: Conrad S Weiden, Chapel Hill, NC (US)

(73) Assignee: Schneider Electric USA, Inc., Andover, MA (US)

( * ) Notice: Subject to any disclaimer, the term of this patent is extended or adjusted under 35 U.S.C. 154(b) by 0 days.

(21) Appl. No.: 15/843,452

(22) Filed: Dec. 15, 2017

(51) Int. Cl.
*H05K 5/02* (2006.01)
*E05B 17/20* (2006.01)
*H05K 5/03* (2006.01)

(52) U.S. Cl.
CPC .......... *H05K 5/0208* (2013.01); *E05B 17/20* (2013.01); *H05K 5/03* (2013.01)

(58) Field of Classification Search
CPC ......... H05K 5/0208; H05K 5/03; E05B 17/20
See application file for complete search history.

(56) References Cited

U.S. PATENT DOCUMENTS

| 2,698,361 | A | * | 12/1954 | Mekelburg | ............ | H01H 9/223 200/337 |
| 4,612,424 | A | | 9/1986 | Clark et al. | | |
| 6,998,549 | B1 | * | 2/2006 | Bender | ................ | H02B 11/133 200/401 |
| 8,115,127 | B2 | * | 2/2012 | Nguyen | ................... | G05G 1/10 200/330 |

FOREIGN PATENT DOCUMENTS

CN     203056394 U     7/2013

OTHER PUBLICATIONS

English Language Machine Translation of Chinese Patent Application Publication No. CN203056394U, published on Jul. 10, 2013, 5 pages.
Eaton brochure entitled "Double Up on safety with Eaton's double-door, line-side isolation switch", Sep. 2016, 1 page.
Eaton brochure entitled "Double-door line isolation switch—Double down on safety with Eaton's newest switch", Jun. 2017, 2 pages.
"Class 9423 Door-Closing Mechanisms", Dec. 1997, Square D, pp. 36-41.

* cited by examiner

*Primary Examiner* — Adrian S Wilson
(74) *Attorney, Agent, or Firm* — Locke Lord LLP

(57) ABSTRACT

A dual interlock system for electrical equipment enclosures having at least two isolated compartments. The interlock includes a dual function interlock mechanism that prevents a serviceable equipment compartment door from being opened while a local disconnect device located in an adjacent isolated compartment is in the ON state. The dual interlock system also prevents the local disconnect device from unintentionally being moved from an OFF state to the ON state while the serviceable equipment door is open.

20 Claims, 7 Drawing Sheets

ELECTRICAL ENCLOSURE DOOR INTERLOCK

FIELD OF THE INVENTION

The invention is generally directed to electrical enclosures and particularly to cover or door interlocks for electrical enclosures.

BACKGROUND OF THE INVENTION

Electrical and safety codes require anyone accessing electrical equipment that has any energized components to wear some level of personal protective equipment (PPE), which can be uncomfortable and can restrict movement. This includes enclosures that have local disconnect device with energized incoming conductors. A cover/door interlock on enclosures having local disconnects can prevent the cover/door from being opened while the local disconnect is ON but does not disconnect the energized incoming conductors when the local disconnect device is OFF and the cover/door can be opened. Therefore, the alternative to wearing PPE has been to lock OFF and tag a disconnect device upstream to the equipment being serviced. This can mean disconnecting power to other equipment that is not being serviced, but is receiving power from the same upstream disconnect device. Therefore, an electrical enclosure and cover/door interlock system that can permit servicing of the electrical equipment without the need for PPE and lock OFF-tag OFF of an upstream disconnect would be desirable.

SUMMARY OF THE INVENTION

The present invention provides an electrical enclosure and interlock system that permits qualified personnel to service the electrical equipment without wearing PPE and does not require lock OFF-tag OFF of an upstream disconnect device. The electrical enclosure has at least two isolated compartments, one for a local disconnect device and one or more for serviceable electrical equipment receiving power from the local disconnect device. The cover/door for the local disconnect compartment has an interlock that prevents the cover/door from being opened when the local disconnect device in ON. The interlock system of the present invention prevents the equipment compartment door from being opened while the local disconnect device is ON, and after the local disconnect device has been turned OFF and the equipment door has been opened, prevents the local disconnect device from unintentionally being turned ON.

A dual interlock system for an electrical enclosure having a local disconnect compartment for a local disconnect device and an equipment compartment for serviceable electrical equipment, the dual interlock system comprising:
an isolation wall isolating the local disconnect compartment from the equipment compartment, the isolation wall defining an isolation wall aperture;
a rotating operator for moving the local disconnect device between an OFF state and an ON state, the rotating operator defining an arcuate slot;
a local disconnect interlock plate, slidably attached to the isolation wall for movement between a blocked position and an unblocked position, the local disconnect interlock plate defining an interlock plate aperture positioned to coincide with the isolation wall aperture;
an interlock bracket attached to an equipment compartment door, the interlock bracket defining an interlock bracket aperture positioned to coincide with the isolation wall aperture and interlock plate aperture when the equipment compartments door is closed, and;
an interlock bar mechanically connected to the arcuate slot of the rotating operator for back and forth linear movement between a first position in which the local disconnect device is in the OFF state and a second position in which the local disconnect device is in the ON state, in the first position the equipment door can be opened and the local disconnect device is automatically prevented from unintentionally being moved to the ON state while the equipment door is open and in the second position the equipment door can not be opened.

A dual interlock system for an electrical enclosure having a local disconnect compartment for a local disconnect device and an equipment compartment for serviceable electrical equipment, the interlock system comprising:
an isolation wall isolating the local disconnect compartment from the equipment compartment, the isolation wall defining an isolation wall aperture;
a rotating operator for moving the local disconnect device between an OFF state and an ON state, the rotating operator defining an arcuate slot;
a local disconnect interlock plate, slidably attached to the isolation wall for movement between a blocked position when an equipment compartment door is open and an unblocked position when the equipment compartment door is closed, the local disconnect interlock plate defining an interlock plate aperture positioned to coincide with the isolation wall aperture in both blocked and unblocked positions;
an interlock bracket attached to the equipment compartment door, the interlock bracket defining an interlock bracket aperture positioned to coincide with the isolation wall aperture and interlock plate aperture when the equipment compartment's door is closed, and;
an interlock bar, mechanically connected to the arcuate slot of the rotating operator for back and forth linear movement as the local disconnect device is moved between the OFF state and ON state by the rotating operator, the interlock bar having an interlock end passing through the isolation wall aperture and the interlock plate aperture when the local disconnect device is in the OFF state and through the isolation wall aperture, the interlock plate aperture and the interlock bracket aperture when the equipment compartment door is closed and the local disconnect device is in the ON state, thereby preventing the equipment compartment door from being opened while the local disconnect device is in the ON state.

A dual interlock system for an electrical enclosure having a local disconnect compartment for a local disconnect device and an equipment compartment for serviceable electrical equipment, the interlock system comprising:
an isolation wall isolating the local disconnect compartment from the equipment compartment, the isolation wall defining an isolation wall aperture;
a rotating operator for moving the local disconnect device between an OFF state and an ON state, the rotating operator defining an arcuate slot;
a local disconnect interlock plate, slidably attached to the isolation wall for movement between a blocked position when the equipment compartment door is open and an unblocked position when the equipment compartment door is closed, the local disconnect interlock plate defining an interlock plate aperture positioned to coincide with the isolation wall aperture in both blocked and unblocked positions;

a support bar attached to a frame supporting the rotating operator, the support bar and having a distal end supported by a portion of the isolation wall aperture and defining a support bar aperture;

an interlock bracket attached to the equipment compartment door, the interlock bracket defining an interlock bracket aperture positioned to coincide with the isolation wall aperture and interlock plate aperture when the equipment compartments door is closed;

an interlock bar being slidably attached to the support bar, the interlock bar having a drive end and an interlock end, the drive end having a drive pin which is received in the arcuate slot for transferring rotational movement of the rotary operator into back and forth linear movement of the interlock bar as the local disconnect device is moved between the ON and OFF states, the interlock end defining an interlock bar aperture positioned to coincide with the support bar aperture when the local disconnect device in the OFF state, the interlock end of the interlock bar and the distal end of the support bar passing through the isolation wall aperture and the interlock plate aperture when the local disconnect device is in the OFF state and the interlock end of the interlock bar passing through the isolation wall aperture, the interlock plate aperture and the interlock bracket aperture when the equipment compartment door is closed and the local disconnect device is in the ON state, thereby preventing the equipment compartment door from being opened while the local disconnect device is in the ON state, and;

an interlock tab, defined in the interlock plate aperture, the interlock tab being slidably received in the interlock bar aperture and the support bar aperture when the local disconnect interlock plate is in the blocked position, thereby preventing the local disconnect device from being unintentionally moved from the OFF state to the ON state while the equipment compartment door is open.

DETAILED DESCRIPTION OF THE EMBODIMENTS

Figure 1:
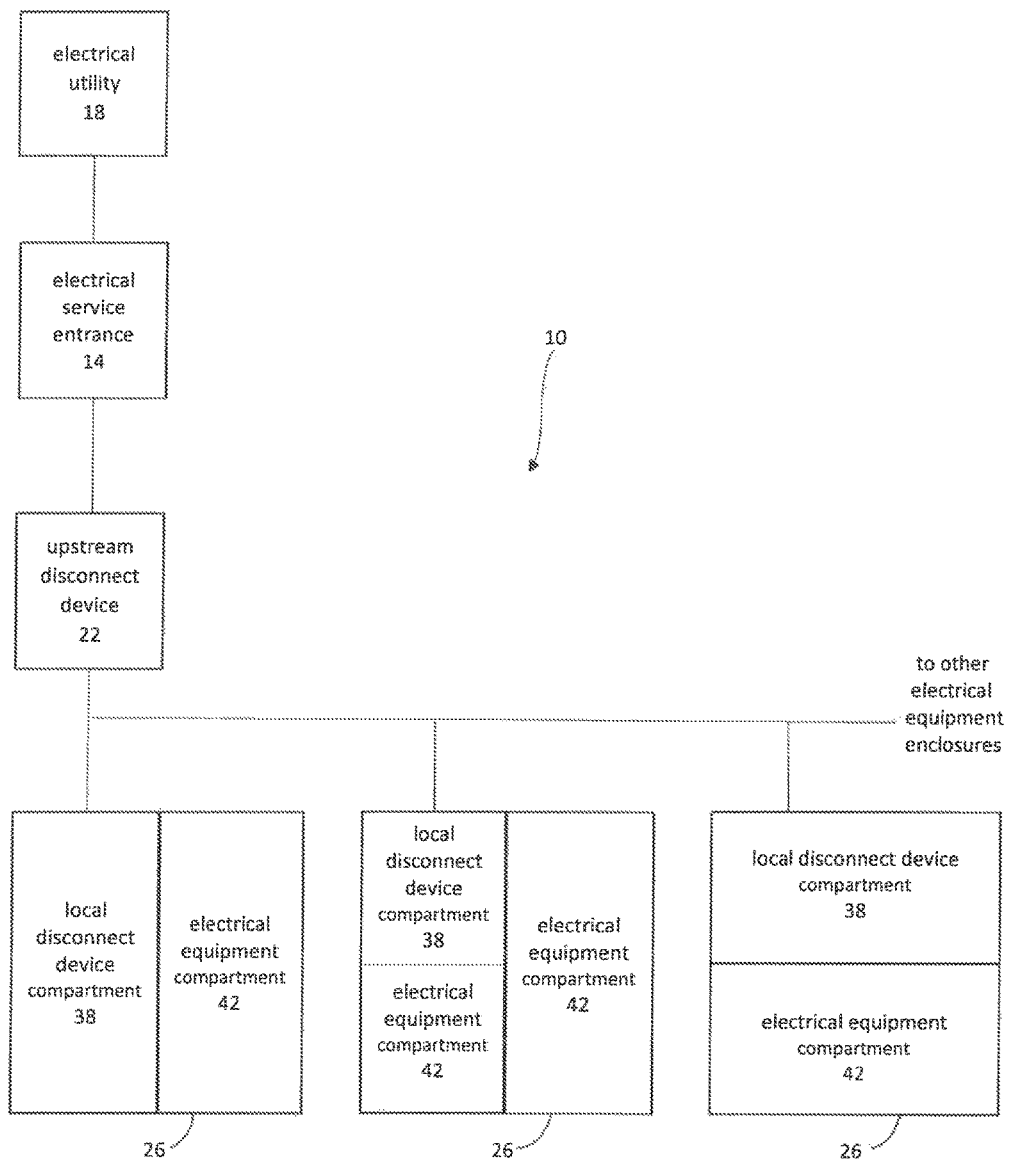
FIG. 1 illustrates an electrical system including multiple electrical enclosures with at least two isolated compartments.
Figure 2:
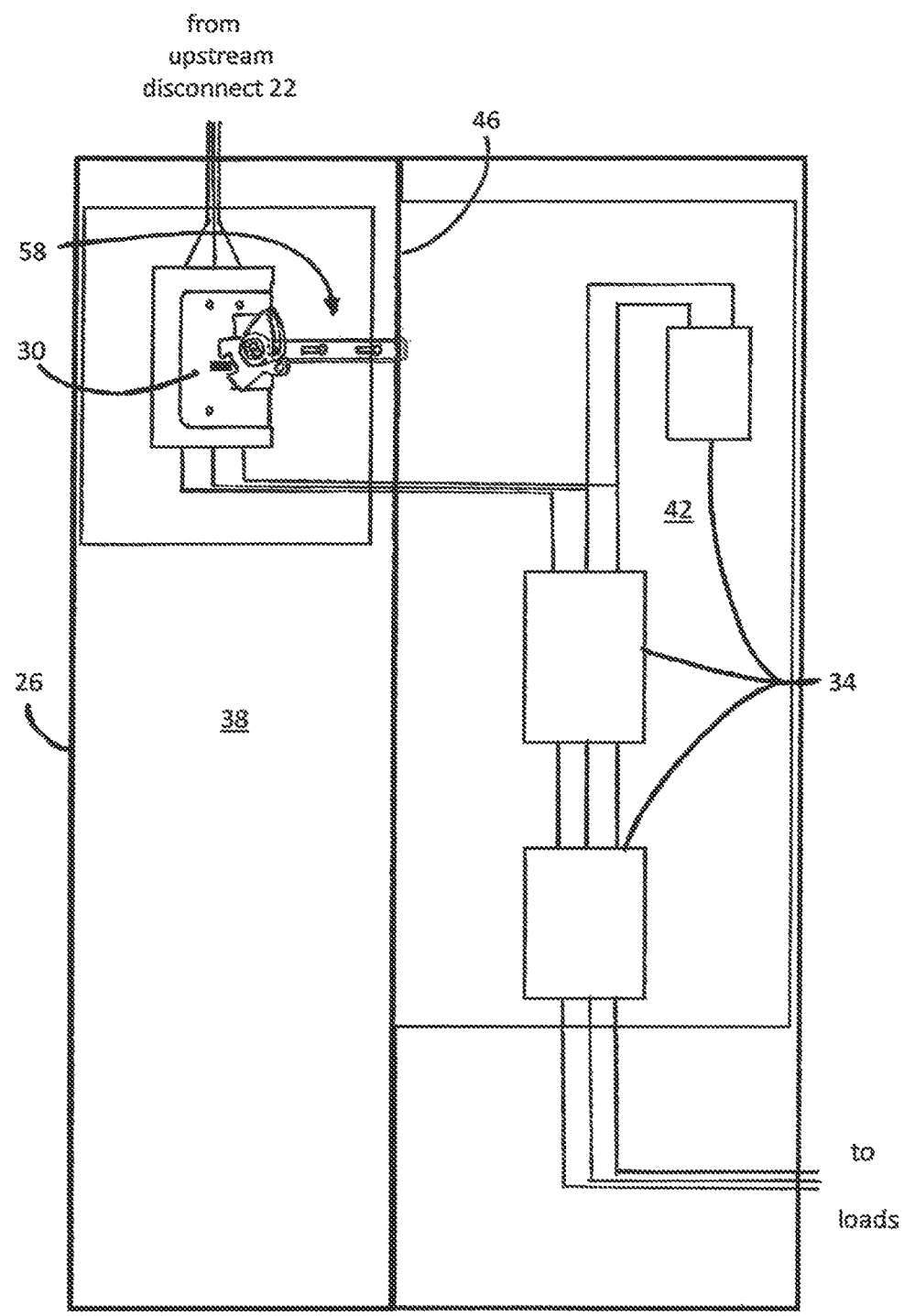
FIG. 2 illustrates an electrical enclosure having a compartment for a local disconnect device and a compartment for serviceable electrical equipment.

Referring now FIG. 1, an electrical system generally indicated by reference number 10 is shown. The electrical system 10 includes a service entrance 14 where power from an electrical utility 18 enters the building, an upstream disconnect 22 which provides power to one or more electrical enclosures 26, each including a local disconnect device 30 and serviceable electrical equipment 34 (FIG. 2). The electrical enclosures 26 have one local disconnect compartment 38 for the local disconnect device 30 and at least one equipment compartment 42 for the serviceable electrical equipment 34.

Referring now to FIG. 2, an individual electrical enclosure 26 is discussed. Power from the upstream disconnect 22 enters the electrical enclosure 26 through the local disconnect compartment 38. The local disconnect 30, which can be a breaker, switch or other device capable of interrupting current flow, is located in the local disconnect compartment 38. The serviceable electrical equipment 34, which can include, but is not limited to, contactors, transformers, sub breakers, motor control devices, etc., is located in the equipment compartment 42. Compartments 38 and 42 are isolated from one another by isolation walls 46. A local disconnect cover/door 50 (FIGS. 5 and 7) providing access to the local disconnect compartment 38 can be secured by screws, latches or other means and can have an interlock (not shown) such as described in U.S. Pat. No. 4,612,424, which prevents opening or removal of the local disconnect cover/door 50 while the local disconnect device 30 is in an ON state. An equipment door 54 (FIGS. 5 and 7), providing access to the equipment compartment 42, is secured by an interlock system 58. The interlock system 58 prevents the equipment door 54 from being opened when the local disconnect device 30 is in an ON state providing power to the serviceable equipment 34. The interlock system 58, which is described in greater detail below, is operatively connected to a rotating operator 62 (FIGS. 4, 6 and 8), which operates the local disconnect device 30 between its ON and OFF states. The rotating operator 62 includes a handle and shaft (not shown) that extends through the local disconnect cover/door 50 permitting operation of the local disconnect device 30 without removing/opening the cover/door 50.

Figure 3:
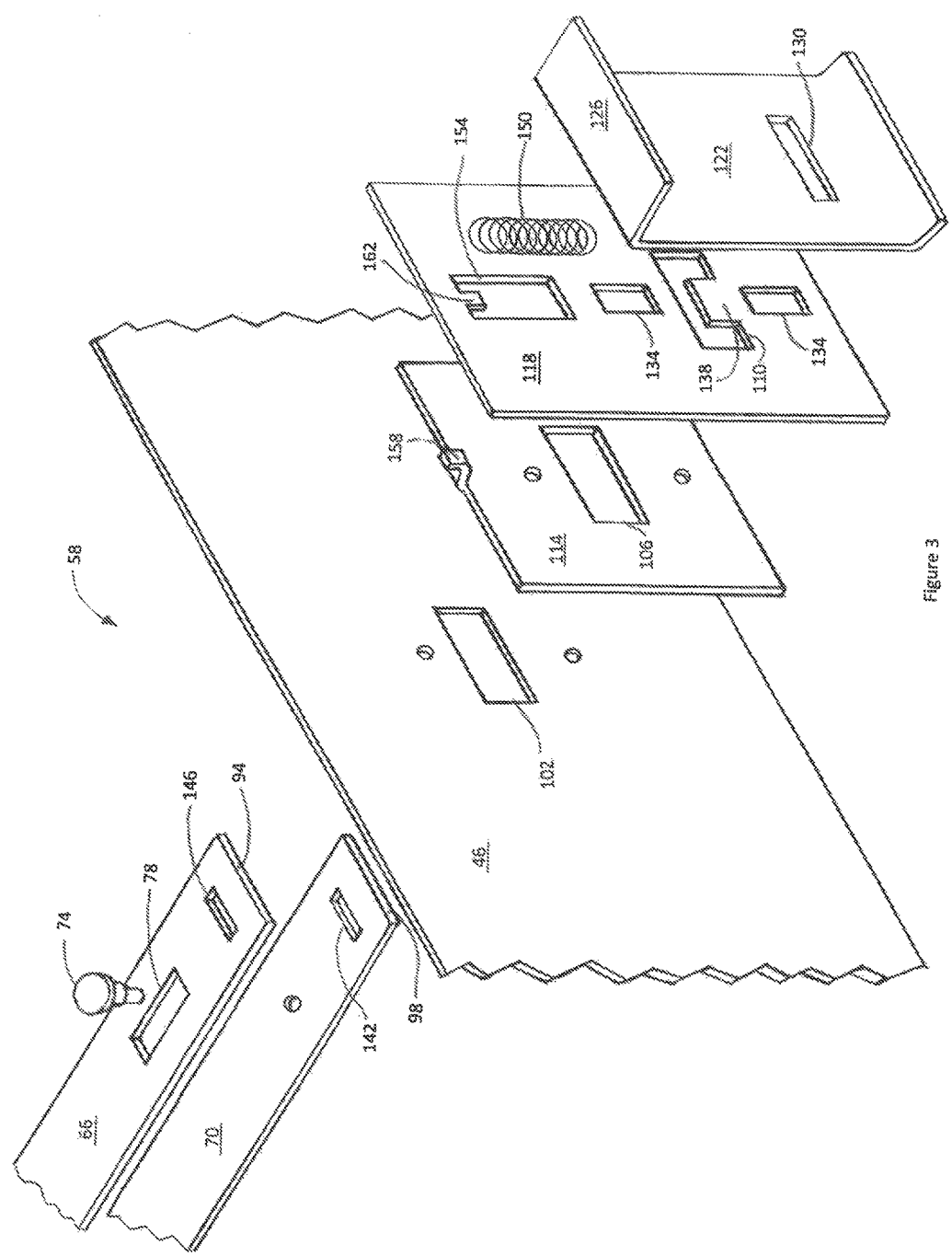
FIG. 3 is an exploded view of elements of the interlock system of the present invention.
Figure 4:
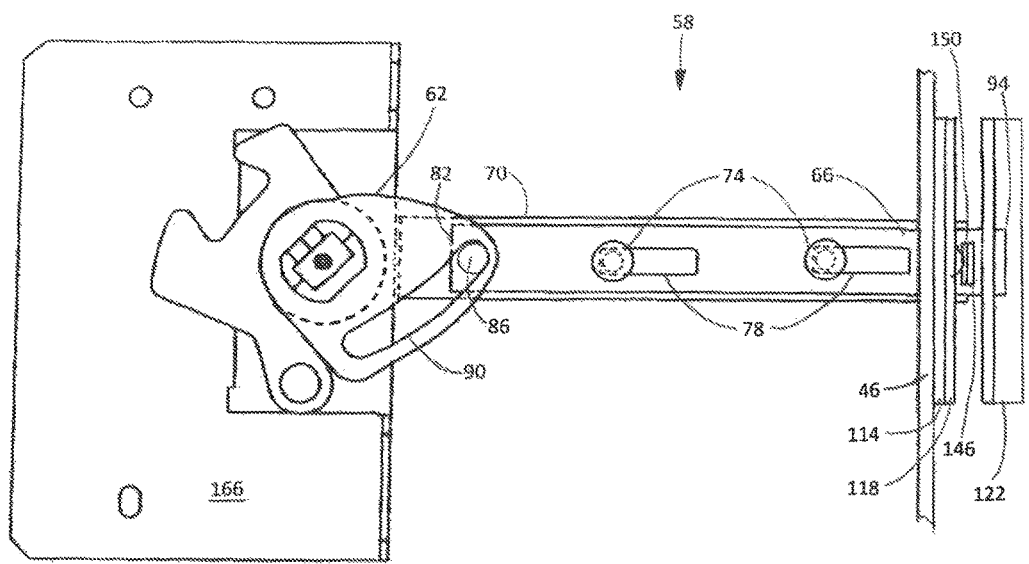
FIG. 4 illustrates a local disconnect device in the ON position with an interlock system of the present invention.
Figure 6:
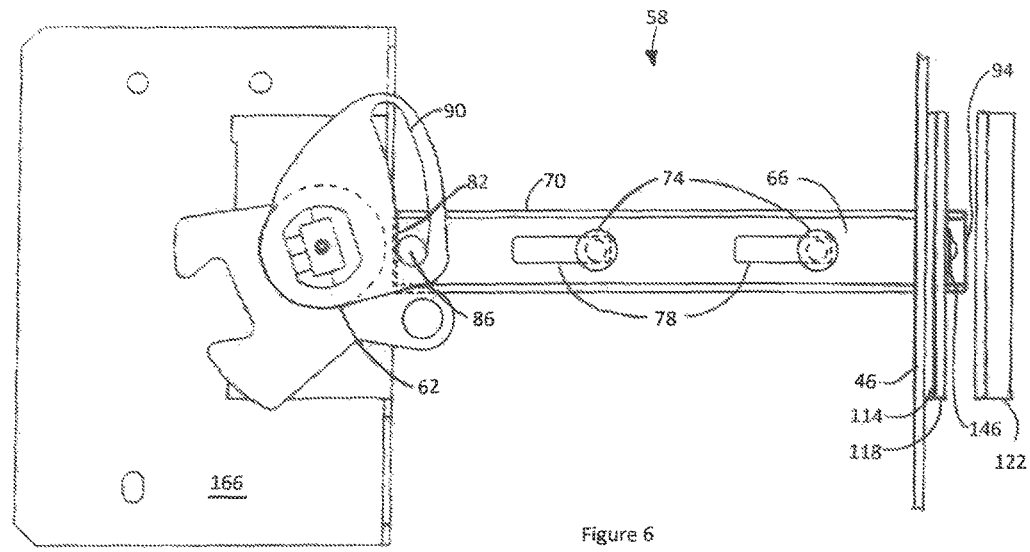
FIG. 6 illustrates a local disconnect device in the OFF position with an interlock of the present invention.
Figure 7:
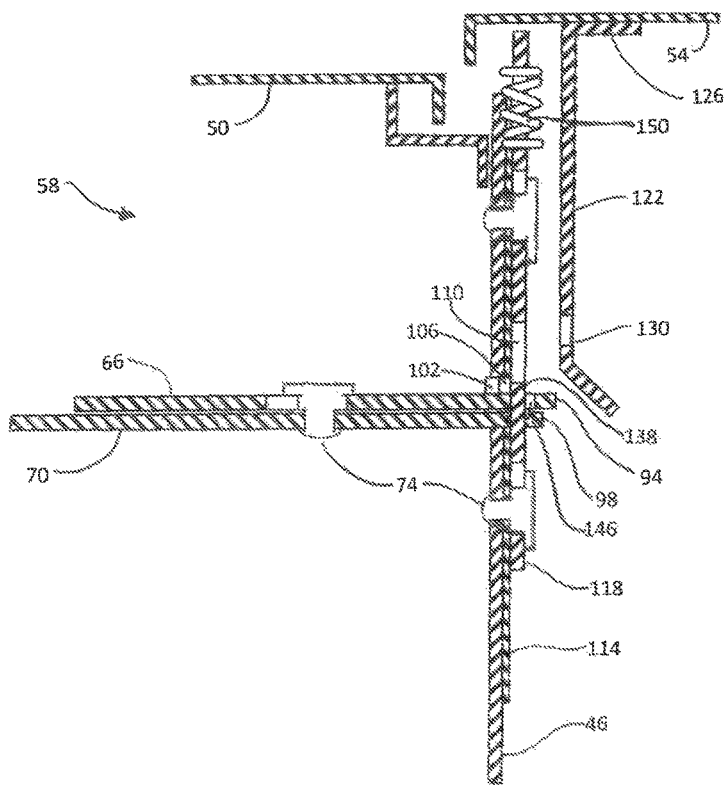
FIG. 7 is a cross-section of the interlock of FIG. 4.
Figure 9:
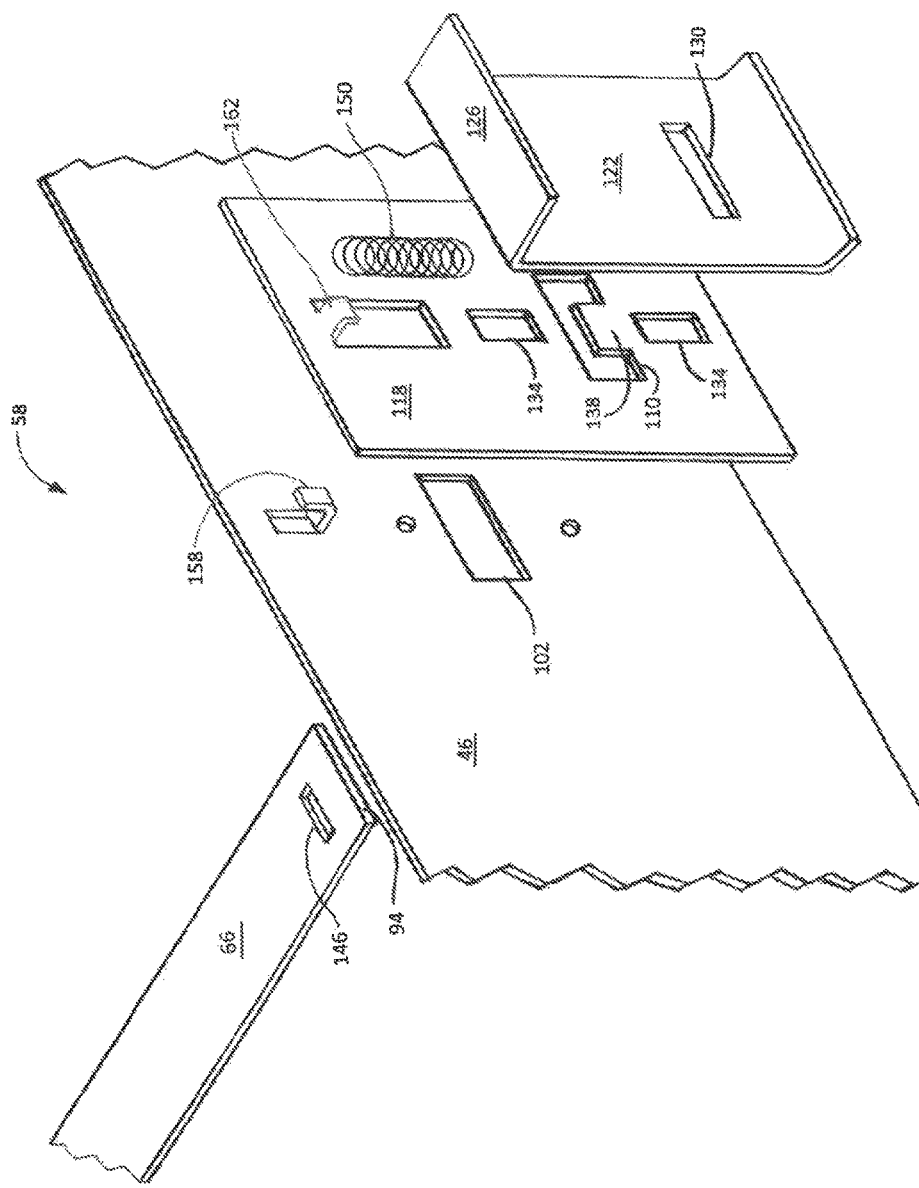
FIG. 9 is an exploded view of elements of a second embodiment of the interlock system of the present invention.

Referring now to FIG. 3, an exploded view of the interlock system 58 components is shown. An interlock bar 66 is slideably attached to a support bar 70 by known means, such as shoulder rivets 74, which are received in apertures 78. The following description of the invention includes the support bar 70, however, if the distance between the rotating operator 62 and the isolation wall 46 is relatively small (less than 6 inches) and/or the interlock bar 66 is made from 12 gauge or stronger steel or has stiffening flanges or similar features, the support bar 70 can be optional, as shown in FIG. 9. A drive end 82 of the interlock bar 66 mechanically engages the rotating operator 62 such that the interlock bar 66 can be moved between a first position in which the local disconnect device 30 is in an OFF state (shown in FIGS. 4, and 5) and a second position in which the local disconnect device 30 is in an ON state (shown in FIGS. 6 and 7). When the interlock bar 66 is in the first position equipment door 54 can be opened and the local disconnect device 30 is automatically prevented from being moved to the ON state while the equipment door 54 is open and when the interlock bar 66 is in the second position the equipment door 54 can not be opened. The mechanical engagement can be accomplished by means such as a shoulder rivet or drive pin 86 attached to the drive end 82 of the interlock bar 66 and received in an arcuate slot 90 defined in the rotating operator 62 (FIGS. 4 and 6). An interlock end 94 of the interlock bar 66 and a distal end 98 of the support bar 70 extend through an isolation wall aperture 102 defined in the isolation wall 46, a spacer aperture 106 defined in a spacer 114 attached to the equipment compartment side of isolation wall 46 and an interlock plate aperture 110 defined in a local disconnect interlock plate 118. The equipment door 54 (FIGS. 5 and 7)

includes an interlock bracket 122 having a flange 126 fixed to the inside surface of the equipment door 54, by welding or similar means. In order to provide a better view of the orientation of the interlock components flange 126 is not shown in FIGS. 4, 6 and 8. When the equipment door 54 is closed (FIGS. 4 and 5), the interlock bracket 122 is in juxtaposed position with the local disconnect interlock plate 118. In this position, an interlock bracket aperture 130 defined in the interlock bracket 122 coincides with apertures 102, 106 and 110, permitting the interlock end 94 of the interlock bar 66 to pass through interlock bracket aperture 130 when the local disconnect device 30 is in the ON state (FIGS. 4 and 5). This prevents the equipment door 54 from being opened while the local disconnect is in the ON state. The local disconnect interlock plate 118 is slidably attached to spacer 114 and isolation wall 46 by known means, such as shoulder rivets 74, which are received in apertures 134. Local disconnect interlock plate 118 includes an interlock tab 138 that extends upward into the interlock plate aperture 110. When the local disconnect device 30 is in the OFF state, a support bar aperture 142 defined in the distal end 98 of support bar 70 coincides with an interlock bar aperture 146 defined in the interlock end 94 of interlock bar 66. Both apertures 142 and 146 are in the plane of the local disconnect interlock plate 118 such that when the equipment door 54 is opened the interlock plate 118 is biased upward from an unblocked position to a blocked position by a spring 150 positioned between the spacer 114 and the local disconnect interlock plate 118. The spacer 114 provides room between the isolation wall 46 and the local disconnect interlock plate 118 for the spring 150 to move. This upward movement of the local disconnect interlock plate 118 causes the interlock tab 138 of the local disconnect interlock plate 118 to be slidably received in apertures 142 and 146 (FIG. 7). This engagement prevents the interlock bar 66 from moving and thereby prevents the local disconnect device 30 from being unintentionally moved to the ON state while the equipment door 54 is open. The spring 150 is maintained in a window 154 defined in the local disconnect interlock plate 118 by a first spring hook 158 formed from the spacer 114 and extending upwardly and a second spring hook 162 formed from the local disconnect interlock plate 118 and extending downwardly from the top of the window 154. It is also envisioned that the first spring hook 158 can be formed from the isolation wall 46 and thereby eliminate the need for spacer 114 as shown in FIG. 9.

Referring now to FIG. 4, a top view of the interlock system 58 is shown when the local disconnect device 30 is in the ON state. The arcuate slot 90 of the rotating operator 62 changes the circular motion of the rotating operator 62 into the back and forth motion of the interlock bar 66 by engaging the drive pin 86 attached to the drive end 82 of the interlock bar 66. The support bar 70 is attached to a frame 166, which also supports the rotating operator 62. The distal end 98 of the support bar 66 can be supported by a lower edge of the isolation wall aperture 102 and spacer aperture 106 if the spacer 114 is present.

Figure 5:
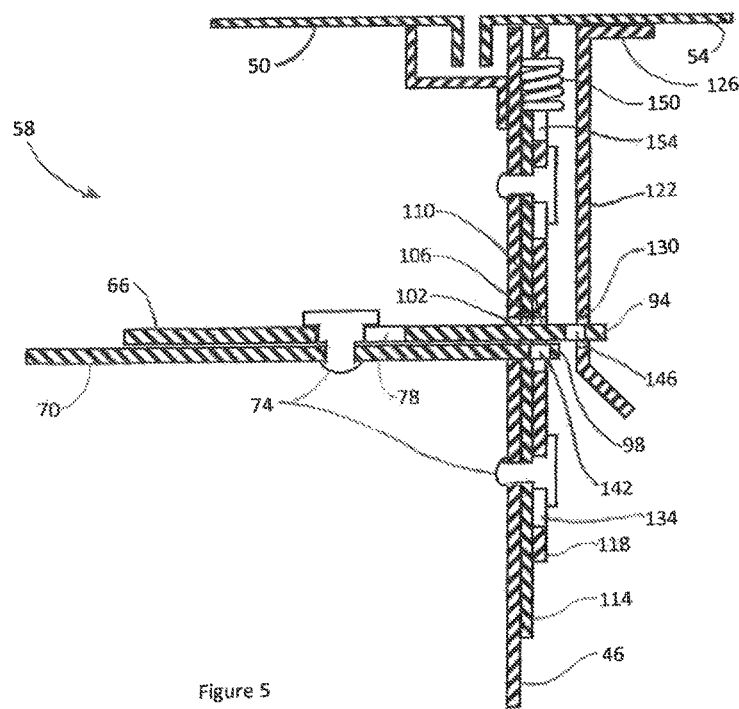
FIG. 5 is a cross-section of the interlock of FIG. 4.

Referring now to FIG. 5, a cross-sectional view illustrates the positions of the interlock end 94 of the interlock bar 66, interlock plate 118 and interlock bracket 122 when the equipment door 54 is closed and the local disconnect device 30 is in the ON state.

Referring now to FIG. 6, a top view of the interlock system 58 is shown when the local disconnect device 30 is in the OFF state. The interlock end 94 of the interlock bar 66 extends slightly through apertures 102, 106 and 110 defined in the isolation wall 46, spacer 114 and interlock bracket 122, respectively, but does not enter aperture 130 of the interlock bracket 122.

Referring now to FIG. 7, a cross-sectional view illustrates the positions of the interlock end 94 of the interlock bar 66, the interlock plate 118 and its associated interlock tab 138 and interlock bracket 122 when the equipment door 54 is open and the local disconnect device 30 is in the OFF state. When the equipment door 54 is opened, spring 150 pushes the interlock plate 118 and its associated interlock tab 138 upward causing the interlock tab 138 to be received in apertures 142 and 146 of support bar 70 and interlock bar 66, respectively. While interlock tab 138 is received in interlock bar aperture 146 the interlock bar 66 can not move, thereby preventing the local disconnect device 30 from unintentionally being placed in the ON state while the equipment door 54 is open.

Figure 8:
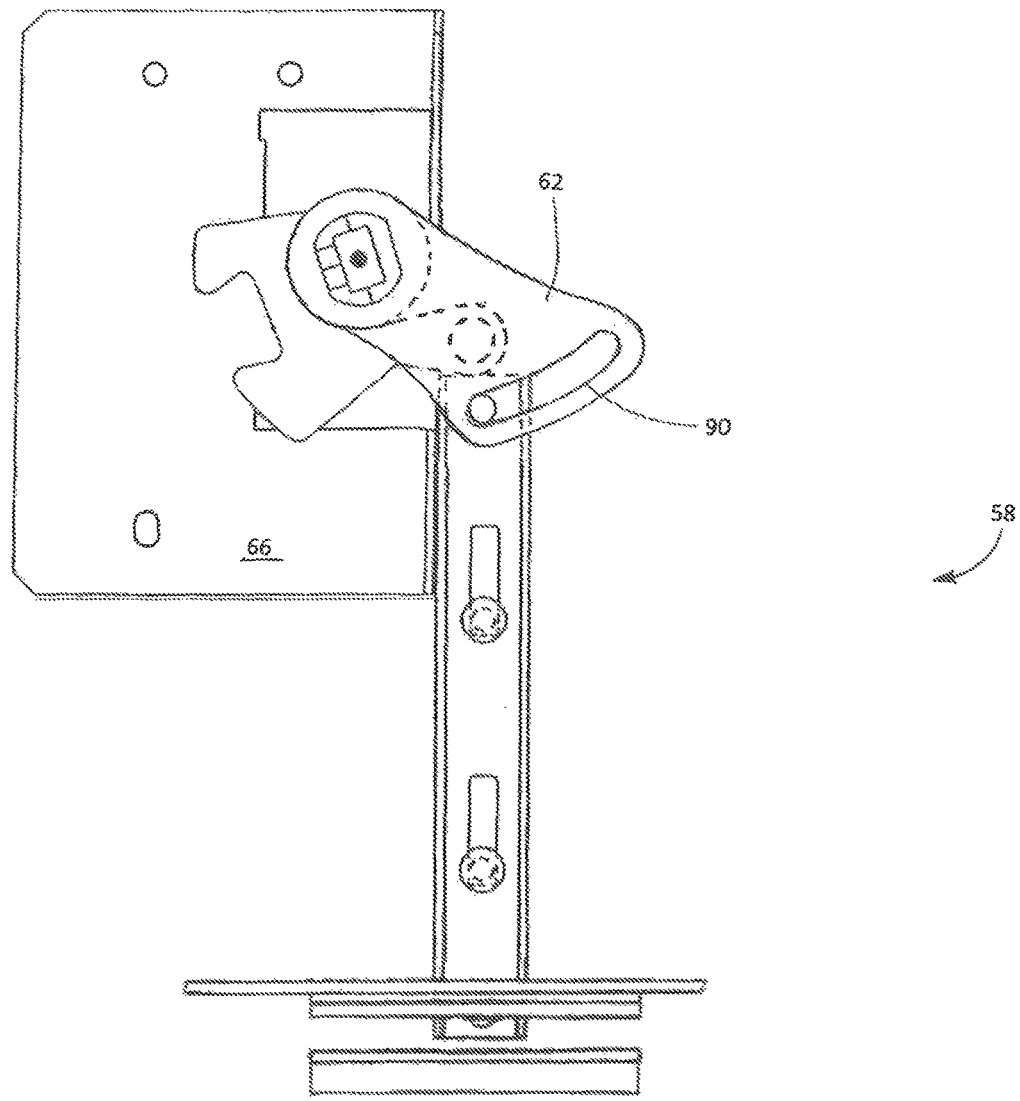
FIG. 8 illustrates a local disconnect device in the OFF position with the interlock of the present invention in a different orientation with respect to FIGS. 4-7.

Referring now to FIG. 8, a top view of a second orientation of the interlock system 58 is illustrated. In the previous examples, the local disconnect compartment 38 and equipment compartment 42 were arranged side-by-side horizontally. In the second orientation of FIG. 8, the local disconnect compartment 38 and serviceable equipment compartment 42 are arranged vertically such that one is above the other. The interlock system 58 for this embodiment uses the same basic components with slight alterations of the arcuate slot 90 location in the rotating operator 62 to accommodate the required back and forth movement of the interlock bar 66. The support bar 70 is attached to the frame 166 as in the previous embodiment. In the event that there are equipment compartments 42 beside and below the local disconnect compartment 38 the rotating operator 62 can include two arcuate slots 90 for interlocking both equipment compartment doors 54 with the local disconnect device 30.

Referring now to FIG. 9, an alternate construction wherein the support bar 70 and spacer 114 are not required is disclosed. When the support bar 70 is eliminate the drive end 82 of the interlock bar 66 is mechanically connected to the arcuate slot 90 of rotating operator 62 by a shoulder rivet or threaded fastener and the interlock end 94 is supported by the isolation wall aperture 102. The spring 50 is maintained in window 154 by the first spring hook 158 formed from the isolation wall 46 and the second spring hook 162 formed from part of window 154 of interlock plate 118.

I claim:

1. A dual interlock system for an electrical enclosure having a local disconnect compartment for a local disconnect device and an equipment compartment for serviceable electrical equipment, the dual interlock system comprising:
    an isolation wall isolating the local disconnect compartment from the equipment compartment, the isolation wall defining an isolation wall aperture;
    a rotating operator for moving the local disconnect device between an OFF state and an ON state, the rotating operator defining an arcuate slot;
    a local disconnect interlock plate, slidably attached to the isolation wall for movement between a blocked position and an unblocked position, the local disconnect interlock plate defining an interlock plate aperture positioned to coincide with the isolation wall aperture;
    an interlock bracket attached to an equipment compartment door, the interlock bracket defining an interlock bracket aperture positioned to coincide with the isolation wall aperture and interlock plate aperture when the equipment compartments door is closed; and;

an interlock bar mechanically connected to the arcuate slot of the rotating operator for back and forth linear movement between a first position in which the local disconnect device is in the OFF state and a second position in which the local disconnect device is in the ON state, in the first position the equipment door can be opened and the local disconnect device is automatically prevented from unintentionally being moved to the ON state while the equipment door is open and in the second position the equipment door can not be opened.

2. The dual interlock system of claim 1, wherein the interlock bar includes a drive end having a drive pin which is received in the arcuate slot, the drive pin converting the rotational movement of the rotating operator when the local disconnect device is moved between the OFF and ON states into a back and forth linear movement of the interlock bar.

3. The dual interlock system of claim 1, wherein the interlock bar has an interlock end passing through the isolation wall aperture, the interlock plate aperture and the interlock bracket aperture when the interlock bar is in the second position, thereby preventing the equipment compartment door from being opened when the local disconnect device is in the ON state.

4. The dual interlock system of claim 1, wherein the local disconnect device interlock plate is biased into the blocked position when the interlock bar is in the second position and the equipment door is OPEN and into the unblocked position when the equipment door is CLOSED.

5. The dual interlock system of claim 1, wherein the interlock plate is biased to the blocked position by a spring compressed between a first spring hook formed in the isolation wall and a second spring hook formed in the local disconnect interlock plate, the spring being maintained in a window defined in the interlock plate.

6. The dual interlock system of claim 5, wherein a spacer can be inserted between the isolation wall and the interlock plate to provide room for the spring to move.

7. The dual interlock system of claim 1, wherein an interlock bar aperture is defined in an interlock end of the interlock bar, the interlock bar aperture being located such that an interlock tab defined in the interlock plate and extending into the interlock plate aperture can be received in the interlock bar aperture when the interlock bar is in the second position and the interlock plate is moved to the blocked position by opening the equipment compartment door.

8. The dual interlock system of claim 7, wherein the interlock bar can be slidably attached to a support bar, the support bar having a distal end that extends through the isolation wall aperture and interlock plate aperture, a support bar aperture is defined in the distal end of the support bar such that it coincides with the interlock bar aperture when the interlock bar is in the second position.

9. The dual interlock system of claim 1, wherein the rotating operator can define more than one arcuate slot such that multiple equipment compartment doors can be simultaneously interlocked to prevent opening when a common local disconnect device is in the ON state or prevent the common local disconnect device from being unintentionally moved from the OFF state to the ON state while any one of the multiple equipment doors is open.

10. A dual interlock system for an electrical enclosure having a local disconnect compartment for a local disconnect device and an equipment compartment for serviceable electrical equipment, the interlock system comprising:

an isolation wall isolating the local disconnect compartment from the equipment compartment, the isolation wall defining an isolation wall aperture;
a rotating operator for moving the local disconnect device between an OFF state and an ON state, the rotating operator defining an arcuate slot;
a local disconnect interlock plate, slidably attached to the isolation wall for movement between a blocked position when an equipment compartment door is open and an unblocked position when the equipment compartment door is closed, the local disconnect interlock plate defining an interlock plate aperture positioned to coincide with the isolation wall aperture in both blocked and unblocked positions;
an interlock bracket attached to the equipment compartment door, the interlock bracket defining an interlock bracket aperture positioned to coincide with the isolation wall aperture and interlock plate aperture when the equipment compartment's door is closed, and;
an interlock bar, mechanically connected to the arcuate slot of the rotating operator for back and forth linear movement as the local disconnect device is moved between the OFF state and ON state by the rotating operator, the interlock bar having an interlock end passing through the isolation wall aperture and the interlock plate aperture when the local disconnect device is in the OFF state and through the isolation wall aperture, the interlock plate aperture and the interlock bracket aperture when the equipment compartment door is closed and the local disconnect device is in the ON state, thereby preventing the equipment compartment door from being opened while the local disconnect device is in the ON state.

11. The dual interlock system of claim 10, wherein back and forth linear movement of the interlock bar is blocked by the local disconnect interlock plate when the local disconnect interlock plate is in the blocked position, thereby preventing the local disconnect device from being moved to the ON state.

12. The dual interlock system of claim 10, wherein an interlock bar aperture is defined in interlock end of the interlock bar, the interlock bar aperture being located such that an interlock tab defined in the interlock plate and extending into the interlock plate aperture can be received in the interlock bar aperture when the local disconnect device is in the OFF state and the interlock plate is moved to the blocked position by opening the equipment compartment door.

13. The dual interlock system of claim 10, wherein the interlock bar can be slidably attached to a support bar, the support bar having a distal end that extends through the isolation wall aperture and interlock plate aperture, a support bar aperture is defined in the distal end of the support bar such that it coincides with an interlock bar aperture when the local disconnect device is in the OFF state.

14. The dual interlock system of claim 10, wherein the rotating operator can define more than one arcuate slot such that multiple equipment compartment doors can be simultaneously interlocked to prevent opening when a common local disconnect device is in the ON state or prevent the common local disconnect device from being unintentionally moved from the OFF state to the ON state while any one of the multiple equipment doors is open.

15. The dual interlock system of claim 10, wherein the local disconnect interlock plate is biased to the blocked position by a spring compressed between a first spring hook formed from the isolation wall and a second spring hook formed from the local disconnect interlock plate, the spring being maintained in a window defined in the local disconnect interlock plate.

16. The dual interlock system of claim 15, wherein a spacer can be inserted between the isolation wall and the interlock plate to provide room for the spring to move.

17. A dual interlock system for an electrical enclosure having a local disconnect compartment for a local disconnect device and an equipment compartment for serviceable electrical equipment, the interlock system comprising:
   an isolation wall isolating the local disconnect compartment from the equipment compartment, the isolation wall defining an isolation wall aperture;
      a rotating operator for moving the local disconnect device between an OFF state and an ON state, the rotating operator defining an arcuate slot;
      a local disconnect interlock plate, slidably attached to the isolation wall for movement between a blocked position when the equipment compartment door is open and an unblocked position when the equipment compartment door is closed, the local disconnect interlock plate defining an interlock plate aperture positioned to coincide with the isolation wall aperture in both blocked and unblocked positions;
      a support bar attached to a frame supporting the rotating operator, the support bar and having a distal end supported by a portion of the isolation wall aperture and defining a support bar aperture;
      an interlock bracket attached to the equipment compartment door, the interlock bracket defining an interlock bracket aperture positioned to coincide with the isolation wall aperture and interlock plate aperture when the equipment compartments door is closed;
      an interlock bar being slidably attached to the support bar, the interlock bar having a drive end and an interlock end, the drive end having a drive pin which is received in the arcuate slot for transferring rotational movement of the rotary operator into back and forth linear movement of the interlock bar as the local disconnect device is moved between the ON and OFF states, the interlock end defining an interlock bar aperture positioned to coincide with the support bar aperture when the local disconnect device in the OFF state, the interlock end of the interlock bar and the distal end of the support bar passing through the isolation wall aperture and the interlock plate aperture when the local disconnect device is in the OFF state and the interlock end of the interlock bar passing through the isolation wall aperture, the interlock plate aperture and the interlock bracket aperture when the equipment compartment door is closed and the local disconnect device is in the ON state, thereby preventing the equipment compartment door from being opened while the local disconnect device is in the ON state, and;
      an interlock tab, defined in the interlock plate aperture, the interlock tab being slidably received in the interlock bar aperture and the support bar aperture when the local disconnect interlock plate is in the blocked position, thereby preventing the local disconnect device from being unintentionally moved from the OFF state to the ON state while the equipment compartment door is open.

18. The dual interlock system of claim 17, wherein the local disconnect interlock plate is moved to the blocked position by a spring maintained in a window defined in the local disconnect interlock plate, the spring being compressed between a first spring hook formed in the isolation wall and a second spring hook formed in the window of the local disconnect interlock plate.

19. The dual interlock system of claim 18, wherein a spacer can be inserted between the isolation wall and the interlock plate to provide room for the spring to move.

20. The dual interlock system of claim 17, wherein the rotating operator can define more than one arcuate slot such that multiple equipment compartment doors can be simultaneously interlocked to prevent opening when a common local disconnect device is in the ON state or prevent the common local disconnect device from being unintentionally moved from the OFF state to the ON state while any one of the multiple equipment doors is open.

* * * * *